(12) United States Patent
Igarashi et al.

(10) Patent No.: US 7,063,901 B2
(45) Date of Patent: Jun. 20, 2006

(54) ORGANIC ELECTROLUMINESCENT DEVICE

(75) Inventors: Tatsuya Igarashi, Kanagawa (JP); Kohsuke Watanabe, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 116 days.

(21) Appl. No.: 10/670,005

(22) Filed: Sep. 25, 2003

(65) Prior Publication Data
US 2004/0065544 A1    Apr. 8, 2004

(30) Foreign Application Priority Data
Sep. 30, 2002    (JP)    ............ P.2002-287390

(51) Int. Cl.
H05B 33/14 (2006.01)
H01L 27/32 (2006.01)
H01L 51/50 (2006.01)
H01L 51/52 (2006.01)
H01L 51/54 (2006.01)

(52) U.S. Cl. ............ 428/690; 428/917; 313/504; 313/506; 252/301.16; 204/296

(58) Field of Classification Search ............ 428/690, 428/917; 313/504, 506; 252/301.16; 204/296

See application file for complete search history.

(56) References Cited

U.S. PATENT DOCUMENTS 6,303,231 B1    10/2001    Sawada et al.
6,420,057 B1    7/2002    Ueda et al.

FOREIGN PATENT DOCUMENTS

| JP | 02-213088 A | * | 8/1990 |
| JP | 2000-277262 A | * | 10/2000 |
| JP | 200-355687 A | * | 12/2000 |
| WO | WO 2001/92437 A1 | * | 12/2001 |

OTHER PUBLICATIONS

M.A. Baldo, et al., Highly efficient phosphorescent emission from organic electroluminescent devices, vol. 395, Nature, Sep. 10, 1998, pp. 151-154.

C.W. Tang, et al., Organic electroluminescent diodes, vol. 51, No. 12, Appl. Phys. Lett., Sep. 21, 1987, pp. 913-915.

M.A.Baldo, et al., Very high-efficiency green organic light-emitting devices based on electrophosphorescence, vol. 75, No. 1, Appl. Phys. Lett., Jul. 5, 1999, pp. 4-6.

* cited by examiner

Primary Examiner—Dawn L. Garrett
(74) Attorney, Agent, or Firm—Sughrue Mion, PLLC

(57) ABSTRACT

An organic electroluminescent device comprising: a pair of electrodes; and at lest one organic layer provided between the pair of electrodes, at least one of the at least one organic layer being a light emitting layer, wherein the light-emitting layer comprises a compound represented by the formula (I) as defined herein.

18 Claims, No Drawings

ORGANIC ELECTROLUMINESCENT DEVICE

FIELD OF THE INVENTION

This invention relates to a light-emitting device capable of converting electric energy to light (hereinafter referred to as an electroluminescent device, hereinafter "EL device"), particularly an organic EL device (hereinafter referred to as an OELD). More particularly, this invention relates to an EL device suited for use in the fields of display devices, displays, backlights, light sources for illumination, light sources for recording, exposure or reading, signs or signboards, interior decorations, optical communications, and the like. The invention also relates to a novel light-emitting material.

BACKGROUND OF THE INVENTION

Today various display devices have been researched and developed. Inter alia OELDs have been attracting attention as a promising means for obtaining electroluminescence of high brightness at a low driving voltage. An OELD comprising an organic compound in a thin film formed by vacuum evaporation (see *Appl. Phys. Lett.*, vol. 51, p. 913 (1987)) is among them. The reported EL device has a laminate structure composed of a tris(8-hydroxyquinolinato) aluminum complex (Alq) as an electron-transporting material and an amine compound as a positive hole-transporting material and exhibits markedly improved luminescence characteristics compared with a conventional single layer structure.

It has recently been studied to apply an OELD to high-performance color displays or white light sources. To realize the application it is necessary to improve characteristics of each of blue, green and red OELDs.

A green light emitting device with improved characteristics which utilizes light emission from a tris(ortho-metalated) complex of iridium (III) with 2-phenylpyridine [Ir(ppy)$_3$] has been reported in, e.g., *Appl. Phys. Lett.*, Vol. 75, 4 (1999). The device reported achieves an external quantum efficiency of 8%, which is higher than the 5% level that had been regarded as an upper limit that could be reached by predecessors. However, since the light emitted from the device is limited to green light, applicability as a display device is narrow. It has therefore been demanded to develop a multicolor light-emitting device having high efficiency.

A device containing a platinum porphyrin complex is known to give red emission as described in *Nature*, Vol. 395, 151 (1998) and U.S. Pat. No. 6,303,231B1 but needs improvements with respect to the maximum luminance.

An organic electroluminescent element such as described in U.S. Pat. No. 6,420,057, which comprises a light emission layer containing an organic metal complex having both of an ionic coordinate bond formed between a nitrogen anion and a metal cation and a coordinate bond formed by a nitrogen atom or a chalcogen and a metal is known.

SUMMARY OF THE INVENTION

An object of the present invention is to provide a multicolor LED with satisfactory EL characteristics.

The object of the invention is accomplished by the following OELDs and EL materials.

(1) An OELD comprising a pair of electrodes and at least one organic compound layer including a light-emitting layer provided in between said electrodes, wherein said light-emitting layer contains a compound represented by formula (I):

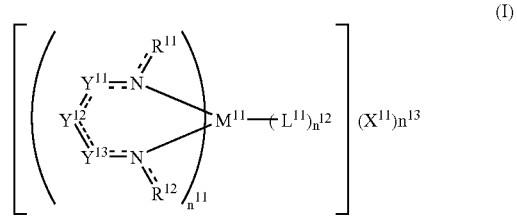

wherein $R^{11}$ and $R^{12}$ each represent a hydrogen atom or a substituent; $Y^{11}$, $Y^{12}$, and $Y^{13}$ each represent a substituted or unsubstituted carbon atom, a substituted or unsubstituted nitrogen atom, an oxygen atom or a sulfur atom; $M^{11}$ represents a transition metal ion; $L^{11}$ represents a ligand; $X^{11}$ represents a counter ion; $n^{11}$ represents an integer of 1 to 3; $n^{12}$ represents an integer of 0 to 4; and $n^{13}$ represents an integer of 0 to 4; provided that a compound in which $R^{11}$ and $R^{12}$ are connected together to form a porphyrin ring is excluded.

(2) An OELD set forth in (1), wherein the compound represented by formula (I) is a compound represented by formula (II):

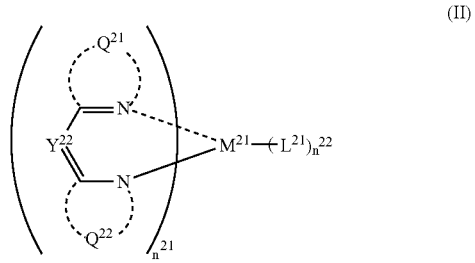

wherein $Q^{21}$ and $Q^{22}$ each represent a group necessary to form a nitrogen-containing heterocyclic ring; $Y^{22}$ represents a nitrogen atom or a substituted or unsubstituted carbon atom; $M^{21}$ represents a transition metal ion; $L^{21}$ represents a ligand; $n^{21}$ represents an integer of 1 to 3; and $n^{22}$ represents an integer of 0 to 4.

(3) An OELD as set forth in (1), wherein the compound represented by formula (I) is a compound represented by formula (III):

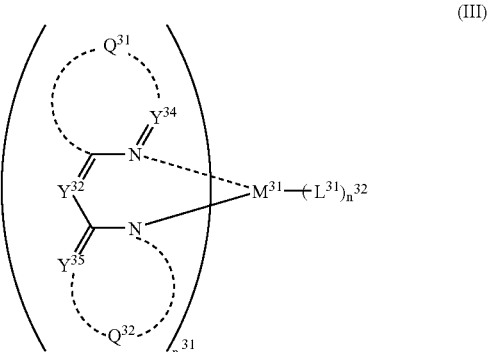

wherein $Q^{31}$ and $Q^{32}$ each represent a group necessary to form a nitrogen-containing heterocyclic ring; $Y^{32}$, $Y^{34}$, and $Y^{35}$ each represent a nitrogen atom or a substituted or unsubstituted carbon atom; $M^{31}$ represents a transition metal ion; $L^{31}$ represents a ligand; $n^{31}$ represents an integer of 1 to 3; and $n^{32}$ represents an integer of 0 to 4.

(4) An OELD as set forth in (2), wherein the compound represented by formula (II) is a compound represented by formula (IV):

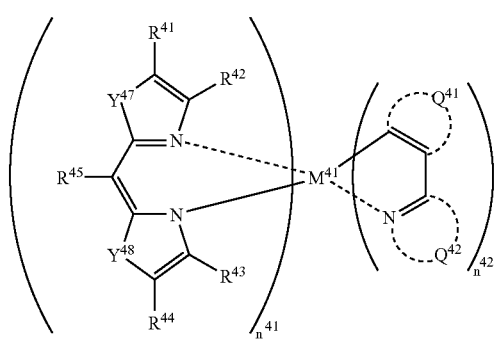

(IV)

wherein $R^{41}$, $R^{42}$, $R^{43}$, $R^{44}$, and $R^{45}$ each represent a hydrogen atom or a substituent; $Y^{47}$ and $Y^{48}$ each represent an oxygen atom, a sulfur atom, a quaternary carbon atom or a substituted or unsubstituted nitrogen atom; $Q^{41}$ represents a group necessary to form an aromatic ring; $Q^{42}$ represents a group necessary to form a nitrogen-containing heterocyclic ring; $n^{41}$ and $n^{42}$ each represent 1 or 2; and $M^{41}$ represents a transition metal ion.

(5) An OELD as set forth in (3), wherein the compound represented by formula (III) is a compound represented by formula (V):

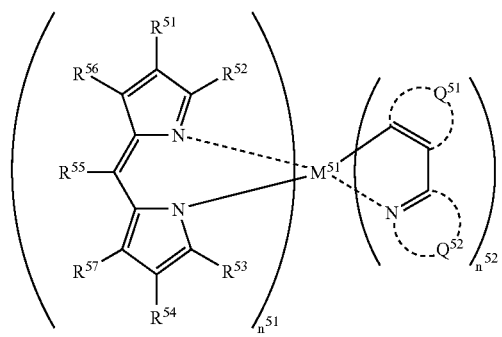

(V)

wherein $R^{51}$, $R^{52}$, $R^{53}$, $R^{54}$, $R^{55}$, $R^{56}$, and $R^{57}$ each represent a hydrogen atom or a substituent; $Q^{51}$ represents a group necessary to form an aromatic ring; $Q^{52}$ represents a group necessary to form a nitrogen-containing heterocyclic ring; $n^{51}$ and $n^{52}$ each represent 1 or 2; and $M^{51}$ represents a transition metal ion.

(6) A compound represented by formula (VI):

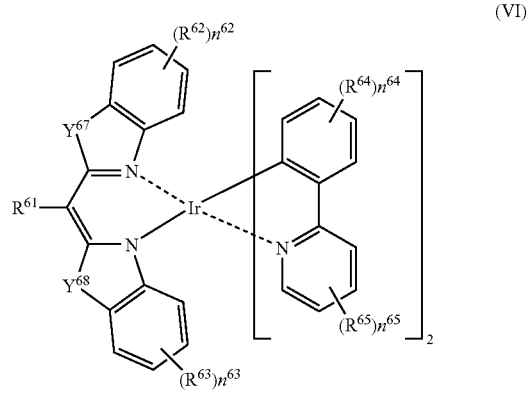

(VI)

wherein $Y^{67}$ and $Y^{68}$ each represent an oxygen atom, a sulfur atom, a quaternary carbon atom or a substituted or unsubstituted nitrogen atom; $R^{61}$, $R^{62}$, $R^{63}$, $R^{64}$, and $R^{65}$ each represent a substituent; and $n^{62}$, $n^{63}$, $n^{64}$, and $n^{65}$ each represent an integer of 0 to 4.

DETAILED DESCRIPTION OF THE INVENTION

In formula (I), each of the bonds $R^{11}$—N, N—$Y^{11}$, $Y^{11}$—$Y^{12}$, $Y^{12}$—$Y^{13}$, $Y^{13}$—N, and N—$R^{12}$ depicted with a solid line and a dotted line may be either a single bond or a double bond.

$R^{11}$ and $R^{12}$ each represent a hydrogen atom or a substituent. $R^{11}$ and $Y^{11}$ may be taken together to form a nitrogen-containing heterocyclic ring. $R^{12}$ and $Y^{13}$ may be taken together to form a nitrogen-containing heterocyclic ring. The substituents represented by $R^{11}$ and $R^{12}$ include an atomic group necessary to form a nitrogen-containing heterocyclic ring when taken together with $Y^{11}$ and $Y^{13}$, respectively, via a linking group (the formed nitrogen-containing heterocyclic group includes pyrrole, benzoxazole, pyridine, pyrazine, pyrimidine, triazine, pyrazole, imidazole, and triazole rings), an alkyl group (preferably having 1 to 30 carbon atoms, still preferably 1 to 20 carbon atoms, particularly preferably 1 to 10 carbon atoms, such as methyl, ethyl, isopropyl, t-butyl, n-octyl, n-decyl, n-hexadecyl, cyclopropyl, cyclopentyl or cyclohexyl), an alkenyl group (preferably having 2 to 30 carbon atoms, still preferably 2 to 20 carbon atoms, particularly preferably 2 to 10 carbon atoms, such as vinyl, allyl, 2-butenyl or 3-pentenyl), an alkynyl group (preferably having 2 to 30 carbon atoms, still preferably 2 to 20 carbon atoms, particularly preferably 2 to 10 carbon atoms, such as propargyl or 3-pentynyl), an aryl group (preferably having 6 to 30 carbon atoms, still preferably 6 to 20 carbon atoms, particularly preferably 6 to 12 carbon atoms, such as phenyl, p-methylphenyl, naphthyl or anthranyl), an amino group (preferably having up to 30 carbon atoms, still preferably up to 20 carbon atoms, particularly preferably up to 10 carbon atoms, such as amino, methylamino, diethylamino, dibenzylamino, diphenylamino, ditolylamino or imino), an alkoxy group (preferably having 1 to 30 carbon atoms, still preferably 1 to 20 carbon atoms, particularly preferably 1 to 10 carbon atoms, such as methoxy, ethoxy, butoxy or 2-ethylhexyloxy), an aryloxy group (preferably having 6 to 30 carbon atoms, still preferably 6 to 20 carbon atoms, particularly preferably 6 to 12 carbon atoms, such as phenyloxy, 1-naphthyloxy or 2-naphthyloxy), a heterocyclic oxy group (preferably having 1 to 30 carbon atoms, still preferably 1 to 20 carbon atoms, particularly preferably 1 to 12 carbon atoms, such as pyridyloxy, pyrazyloxy, pyrimidyloxy or quinolyloxy), an acyl group (preferably having 1 to 30 carbon atoms, still preferably 1 to 20 carbon atoms, particularly preferably 1 to 12 carbon atoms, such as acetyl, benzoyl, formyl or pivaloyl), an alkoxycarbonyl group (preferably having 2 to 30 carbon atoms, still preferably 2 to 20 carbon atoms, particularly preferably 2 to 12 carbon atoms, such as methoxycarbonyl or ethoxycarbonyl), an aryloxycarbonyl group (preferably having 7 to 30 carbon atoms, still preferably 7 to 20 carbon atoms, particularly preferably 7 to 12 carbon atoms, such as phenyloxycarbonyl), a sulfonyl group (preferably having 1 to 30 carbon atoms, still preferably 1 to 20 carbon atoms, particularly preferably 1 to 12 carbon atoms, such as mesyl or tosyl), a hydroxyl group, a heterocyclic group (preferably having 1 to 30 carbon atoms, still preferably 1 to 12 carbon atoms, and containing nitrogen, oxygen, sulfur, etc. as a hetero atom, such as imidazolyl, pyridyl, quinolyl, furyl, thienyl, piperidyl, morpholino, benzoxazolyl, benzimidazolyl, benzothiazolyl, carbazolyl or azevinyl), a silyl group (preferably having 3 to 40 carbon atoms, still preferably 3 to 30 carbon atoms, particularly preferably 3 to 24 carbon atoms, such as trimethylsilyl or triphenylsilyl), a silyloxy group (preferably having 3 to 40 carbon atoms, still preferably 3 to 30 carbon atoms, particularly preferably 3 to 24 carbon atoms, such as trimethylsilyloxy or triphenylsilyloxy), and a group forming a carbon-nitrogen double bond with the adjacent nitrogen atom. These substituents may be substituted.

$R^{11}$ and $R^{12}$ each preferably represent a substituent and still preferably represent a group connected via a linking group to $Y^{11}$ and $Y^{12}$, respectively, to form a nitrogen-containing heterocyclic group.

$Y^{11}$, $Y^{12}$, and $Y^{13}$ each represent a substituted or unsubstituted carbon atom, a substituted or unsubstituted nitrogen atom, a sulfur atom or an oxygen atom. The substituent of the substituted carbon atom as $Y^{11}$, $Y^{12}$ or $Y^{13}$ includes an alkyl group (preferably having 1 to 30 carbon atoms, still preferably 1 to 20 carbon atoms, particularly preferably 1 to 10 carbon atoms, such as methyl, ethyl, isopropyl, t-butyl, n-octyl, n-decyl, n-hexadecyl, cyclopropyl, cyclopentyl or cyclohexyl), an alkenyl group (preferably having 2 to 30 carbon atoms, still preferably 2 to 20 carbon atoms, particularly preferably 2 to 10 carbon atoms, such as vinyl, allyl, 2-butenyl or 3-pentenyl), an alkynyl group (preferably having 2 to 30 carbon atoms, still preferably 2 to 20 carbon atoms, particularly preferably 2 to 10 carbon atoms, such as propargyl or 3-pentynyl), an aryl group (preferably having 6 to 30 carbon atoms, still preferably 6 to 20 carbon atoms, particularly preferably 6 to 12 carbon atoms, such as phenyl, p-methylphenyl, naphthyl or anthranyl), an amino group (preferably having up to 30 carbon atoms, still preferably up to 20 carbon atoms, particularly preferably up to 10 carbon atoms, such as amino, methylamino, dimethylamino, diethylamino, dibenzylamino, diphenylamino or ditolylamno), an alkoxy group (preferably having 1 to 30 carbon atoms, still preferably 1 to 20 carbon atoms, particularly preferably 1 to 10 carbon atoms, such as methoxy, ethoxy, butoxy or 2-ethylhexyloxy), an aryloxy group (preferably having 6 to 30 carbon atoms, still preferably 6 to 20 carbon atoms, particularly preferably 6 to 12 carbon atoms, such as phenyloxy, 1-naphthyloxy or 2-naphthyloxy), a heterocyclic oxy group (preferably having 1 to 30 carbon atoms, still preferably 1 to 20 carbon atoms, particularly preferably 1 to 12 carbon atoms, such as pyridyloxy, pyrazyloxy, pyrimidyloxy or quinolyloxy), an acyl group (preferably having 1 to 30 carbon atoms, still preferably 1 to 20 carbon atoms, particularly preferably 1 to 12 carbon atoms, such as acetyl, benzoyl, formyl or pivaloyl), an alkoxycarbonyl group (preferably having 2 to 30 carbon atoms, still preferably 2 to 20 carbon atoms, particularly preferably 2 to 12 carbon atoms, such as methoxycarbonyl or ethoxycarbonyl), an aryloxycarbonyl group (preferably having 7 to 30 carbon atoms, still preferably 7 to 20 carbon atoms, particularly preferably 7 to 12 carbon atoms, such as phenyloxycarbonyl), an acyloxy group (preferably having 2 to 30 carbon atoms, still preferably 2 to 20 carbon atoms, particularly preferably 2 to 10 carbon atoms, such as acetoxy or benzoyloxy), an acylamino group (preferably having 2 to 30 carbon atoms, still preferably 2 to 20 carbon atoms, particularly preferably 2 to 10 carbon atoms, such as acetylamino or benzoylamino), an alkoxycarbonylamino group (preferably having 2 to 30 carbon atoms, still preferably 2 to 20 carbon atoms, particularly preferably 2 to 12 carbon atoms, such as methoxycarbonylamino), an aryloxycarbonylamino group (preferably having 7 to 30 carbon atoms, still preferably 7 to 20 carbon atoms, particularly preferably 7 to 12 carbon atoms, such as phenyloxycarbonylamino), a sulfonylamino group (preferably having 1 to 30 carbon atoms, still preferably 1 to 20 carbon atoms, particularly preferably 1 to 12 carbon atoms, such as methanesulfonylamino or benzenesulfonylamino), a sulfamoyl group (preferably having up to 30 carbon atoms, still preferably up to 20 carbon atoms, particularly up to 12 carbon atoms, such as sulfamoyl, methylsulfamoyl, dimethylsulfamoyl or phenylsulfamoyl), a carbamoyl group (preferably having 1 to 30 carbon atoms, still preferably 1 to 20 carbon atoms, particularly preferably 1 to 12 carbon atoms, such as carbamoyl, methylcarbamoyl, diethylcarbamoyl or phenylcarbamoyl), an alkylthio group (preferably having 1 to 30 carbon atoms, still preferably 1 to 20 carbon atoms, particularly preferably 1 to 12 carbon atoms, such as methylthio or ethylthio), an arylthio group (preferably having 6 to 30 carbon atoms, still preferably 6 to 20 carbon atoms, particularly preferably 6 to 12 carbon atoms, such as phenylthio), a heterocyclic thio group (preferably having 1 to 30 carbon atoms, still preferably 1 to 20 carbon atoms, particularly preferably 1 to 12 carbon atoms, such as pyridylthio, 2-benzimidazolylthio, 2-benzoxazolylthio or 2-benzothiazolylthio), a sulfonyl group (preferably having 1 to 30 carbon atoms, still preferably 1 to 20 carbon atoms, particularly preferably 1 to 12 carbon atoms, such as mesyl or tosyl), a sulfinyl group (preferably having 1 to 30 carbon atoms, still preferably 1 to 20 carbon atoms, particularly preferably 1 to 12 carbon atoms, such as methanesulfinyl or benzenesulfinyl), a ureido group (preferably having 1 to 30 carbon atoms, still preferably 1 to 20 carbon atoms, particularly preferably 1 to 12 carbon atoms, such as ureido, methylureido or phenylureido), a phosphoric acid amido group (preferably having 1 to 30 carbon atoms, still preferably 1 to 20 carbon atoms, particularly preferably 1 to 12 carbon atoms, such as diethylphosphoric acid amido or phenylphosphoric acid amido), a hydroxyl group, a mercapto group, a halogen atom (e.g., fluorine, chlorine, bromine or iodine), a cyano group, a sulfo group, a carboxyl group, a nitro group, a hydroxamic acid group, a sulfino group, a hydrazino group, an imino group, a heterocyclic group (preferably having 1 to 30 carbon atoms, still preferably 1 to 12 carbon atoms, and containing nitrogen, oxygen, sulfur, etc. as a hetero atom, such as imidazolyl, pyridyl, quinolyl, furyl, thienyl, piperidyl, morpholino, benzoxazolyl, benzimidazolyl, benzothiazolyl, carbazolyl or azevinyl), a silyl group (preferably having 3 to 40 carbon atoms, still preferably 3 to 30 carbon atoms, particularly preferably 3 to 24 carbon atoms, such as trimethylsilyl or triphenylsilyl), and a silyloxy group (preferably having 3 to 40 carbon atoms, still preferably 3 to 30 carbon atoms, particularly preferably 3 to 24 carbon atoms, such as trimethylsilyloxy or triphenylsilyloxy). These substituents may be substituted.

The substituent of the substituted nitrogen atom as $Y^{11}$, $Y^{12}$ or $Y^{13}$ includes those recited as a substituent represented by $R^{11}$.

$Y^{11}$ and $Y^{12}$ each preferably represent a substituted carbon atom or a nitrogen atom, still preferably a substituted carbon atom, particularly preferably a substituted carbon atom bonded to $R^{11}$ or $R^{12}$, respectively, to form a nitrogen-containing heterocyclic group. The nitrogen-containing heterocyclic group formed includes pyrrole, benzoxazole, pyridine, pyrazine, pyrimidine, triazine, pyrazole, imidazole, and triazole rings. $Y^{12}$ is preferably a substituted or unsubstituted carbon atom, still preferably an unsubstituted carbon atom.

$M^{11}$ represents a transition metal ion. The transition metal ion preferably includes, but is not limited to, an iridium ion, a platinum ion, a rhenium ion, and a ruthenium ion. An iridium ion or a platinum ion is still preferred. An iridium ion is particularly preferred.

$L^{11}$ is a ligand. The ligand includes those described in H. Yersin, *Photochemistry and Photophysics of Coordination Compounds,* Springer-Verlag (1987) and Yamamoto Akio, *Yukikinzokukagaku-kiso to ohyo-,* Shokabo Publishing Co. (1982). Preferred ligands include halogen ligands (e.g., chlorine and fluorine), nitrogen-containing heterocyclic ligands (e.g., bipyridyl, phenanthroline, phenylpyridine, pyrazolylpyridine, benzimidazolylpyridine, picoline, thienylpyridine, pyrazolylpyridine, imidazolylpyridine, triazolylpyridine, pyrazolylbenzoxazole, and condensed rings thereof (e.g., phenylquinoline, benzothienylpyridine, and biquinoline)), diketone ligands (e.g., acetylacetone), nitrile ligands (e.g., acetonitrile), a CO ligand, isonitrile ligands (e.g., t-butylisonitrile) phosphorus ligands (e.g., phosphinic acid derivatives, phosphorous ester derivatives, and phosphinine derivatives), and carboxylic acid ligands (e.g., acetic acid). More preferred of them are diketone ligands and bidentate nitrogen-containing heterocyclic ligands. Still more preferred are an acetylacetone ligand, a phenylpyridine ligand, a thienylpyridine ligand, a picoline ligand, and their condensed rings. The most preferred are a phenylpyridine ligand, a thienylpyridine ligand, and condensed rings thereof.

$X^{11}$ is a counter ion. The counter ion includes, but is not limited to, alkali metal ions, alkaline earth metal ions, halide ions, a perchlorate ion, a $PF_6$ ion, ammonium ions (e.g., tetramethylammonium ion), a borate ion, and a phosphonium ion, with a perchlorate ion and a $PF_6$ ion being preferred.

$n^{11}$ represents 1 to 3, preferably 1 or 2. $n^{12}$ represents 0 to 4, preferably 0 to 2. $n^{13}$ represents 0 to 4, preferably 0 or 1, still preferably 0.

Compounds represented by formula (I) in which $R^{11}$ and $R^{12}$ are taken together to form a porphyrin ring are excluded.

Of the compounds of formula (I) preferred are those represented by formula (II) and (III) and their tautomers. The compounds of formula (II) and their tautomers are preferred to the compounds of formula (III) and their tautomers. Of the compounds of formula (I) still preferred are those represented by formula (IV) and their tautomers and those represented by formula (V) and their tautomers. The compounds of formula (IV) and their tautomers are preferred to the compounds of formula (V) and their tautomers. Compounds represented by formula (VI) are the most preferred of the compounds of formula (I).

In formula (II), $Q^{21}$ and $Q^{22}$ each represent a group necessary to form a nitrogen-containing heterocyclic ring. The nitrogen-containing heterocyclic ring formed by $Q^{21}$ or $Q^{22}$ includes, but is not limited to, a pyridine ring, a pyrazine ring, a pyrimidine ring, a pyridazine ring, a triazine ring, a thiazole ring, an oxazole ring, a pyrrole ring, an imidazole ring, a pyrazole ring, a triazole ring, an oxadiazole ring, a thiadiazole ring, and condensed rings containing these heterocyclic rings (e.g., a quinoline ring, a benzazole ring, a benzimidazole ring, and an indolenine ring) and their tautomers. The terminology "tautomer" is intended to include such isomers as, taking a pyrrole ring for instance, the nitrogen-containing 5-membered ring substituted with $R^{51}$, $R^{52}$, and $R^{56}$ in formula (V) (hereinafter the same).

The nitrogen-containing heterocyclic ring formed by $Q^{21}$ or $Q^{22}$ preferably includes a pyridine ring, a quinoline ring, a pyrazine ring, a pyrimidine ring, a pyrrole ring, a pyrazole ring, an imidazole ring, an oxazole ring, a thiazole ring, an oxadiazole ring, thiadiazole ring, a benzazole ring, and their tautomers. More preferred are a pyridine ring, a pyrazole ring, an imidazole ring, an oxazole ring, a pyrrole ring, a benzazole ring, and their tautomers. Still more preferred are a pyrrole ring, a benzazole ring, and their tautomers. A benzazole ring and a tautomer thereof are particularly preferred.

$Y^{22}$ represents a nitrogen atom or a substituted or unsubstituted carbon atom, preferably a substituted or unsubstituted carbon atom, still preferably an unsubstituted carbon atom.

$M^{21}$ and $L^{21}$ have the same meanings as $M^{11}$ and $L^{11}$, respectively. Preferred ranges of $M^{21}$ and $L^{21}$ are the same as for $M^{11}$ and $L^{11}$, respectively.

$n^{21}$ is an integer of 1 to 3, preferably 1 or 2. $n^{22}$ is an integer of 0 to 4, preferably 0 to 2.

In formula (III), $Q^{31}$ and $Q^{32}$ each represent a group necessary to form a nitrogen-containing heterocyclic ring. The nitrogen-containing heterocyclic ring formed by $Q^{31}$ or $Q^{32}$ includes, but is not limited to, a pyridine ring, a pyrazine ring, a pyrimidine ring, a pyridazine ring, a triazine ring, a thiazole ring, an oxazole ring, a pyrrole ring, an imidazole ring, a pyrazole ring, a triazole ring, an oxadiazole ring, a thiadiazole ring, and condensed rings containing these heterocyclic rings (e.g., a quinoline ring, a benzazole ring, a benzimidazole ring, and an indolenine ring) and their tautomers.

The nitrogen-containing heterocyclic ring formed by $Q^{31}$ or $Q^{32}$ preferably includes a pyridine ring, a quinoline ring, a pyrazine ring, a pyrimidine ring, a pyrrole ring, a pyrazole ring, an imidazole ring, an oxazole ring, a thiazole ring, an oxadiazole ring, thiadiazole ring, a benzazole ring, and their tautomers. More preferred are a pyridine ring, a pyrazole ring, an imidazole ring, an oxazole ring, a pyrrole ring, a benzazole ring, and their tautomers. Still more preferred are a pyrrole ring, a benzazole ring, and their tautomers. A benzazole ring and its tautomer are particularly preferred.

$Y^{32}$ has the same meaning as $Y^{22}$. A preferred range of $Y^{32}$ is the same as for $R^{22}$. $Y^{34}$ and $Y^{35}$ each represent a nitrogen atom or a substituted or unsubstituted carbon atom, preferably a substituted or unsubstituted carbon atom.

$M^{31}$, $L^{31}$, $n^{31}$, and $n^{32}$ have the same meanings as $M^{21}$ $L^{21}$, $n^{21}$, and $n^{22}$, respectively. Preferred ranges therefor are the same as for $M^{21}$, $L^{21}$, $n^{21}$, and $n^{22}$, respectively.

In formula (IV), $R^{41}$, $R^{42}$, $R^{43}$, $R^{44}$, and $R^{45}$ each represent a hydrogen atom or a substituent. The substituent includes those previously recited as to the substituents of the substituted carbon atom.

$R^{41}$, $R^{42}$, $R^{43}$, and $R^{44}$ each preferably represent a hydrogen atom, an alkyl group, an aryl group or a group forming a ring (e.g., a benzo-condensed ring) where $R^{41}$ and $R^{42}$ are taken together or where $R^{43}$ and $R^{44}$ are taken together. More preferably, $R^{41}$, $R^{42}$, $R^{43}$, and $R^{44}$ each represent an alkyl group, an aryl group or a group forming a ring (e.g., a benzo-condensed ring) where $R^{41}$ and $R^{42}$ are taken together or where $R^{43}$ and $R^{44}$ are taken together. Most preferably, $R^{41}$ and $R^{42}$, and $R^{43}$ and $R^{44}$ are taken together respectively to form a ring (e.g., a benzo-condensed ring).

$R^{45}$ is preferably a hydrogen atom or an alkyl group, still preferably a hydrogen atom.

$Y^{47}$ and $Y^{48}$ each represent an oxygen atom, a sulfur atom, a quaternary carbon atom or a substituted or unsubstituted nitrogen atom (the substituent of the substituted nitrogen atom preferably includes an alkyl group and an aryl group), preferably an oxygen atom or a substituted nitrogen atom, still preferably an oxygen atom.

$Q^{41}$ represents a group necessary to form an aromatic ring. The aromatic ring formed by $Q^{41}$ includes a benzene ring, a naphthalene ring, a phenanthrene ring, an anthracene ring, a pyridine ring, a pyrazine ring, a pyrimidine ring, a triazine ring, a pyrazole ring, an imidazole ring, a triazole ring, an oxazole ring, a thiazole ring, a furan ring, a thiophene ring, and condensed rings thereof (e.g., a benzothiophene ring). A benzene ring and a thiophene ring are preferred. A benzene ring is still preferred.

$Q^{42}$ represents a group necessary to form a nitrogen-containing heterocyclic ring. The nitrogen-containing heterocyclic ring formed by $Q^{42}$ includes those recited with respect to $Q^{21}$ preferably a pyridine ring, a pyrazine ring, a pyrimidine ring, a pyridazine ring, a benzazole ring, and condensed rings thereof (e.g., a quinoline ring and an isoquinoline ring), still preferably a pyridine ring, a benzazole ring, a quinoline ring, and an isoquinoline ring, particularly preferably a pyridine ring and a quinoline ring.

$n^{41}$ and $n^{42}$ each represent 1 or 2. $n^{41}$ is preferably 1. $n^{42}$ is preferably 2. $M^{41}$ has th same meaning as $M^{11}$. The preferred range of $M^{11}$ applies to $M^{41}$.

In formula (V), $R^{51}$, $R^{52}$, $R^{53}$, $R^{54}$, $R^{56}$, and $R^{57}$ each have the same meaning as $R^{41}$. The preferred range of $R^{41}$ applies to $R^{51}$, $R^{52}$, $R^{53}$, $R^{54}$, $R^{56}$, and $R^{57}$. $R^{55}$ has the same meaning as $R^{45}$, and the preferred range of $R^{45}$ applies to $R^{55}$. $Q^{51}$, $Q^{52}$, $M^{51}$, $n^{51}$, and $n^{52}$ have the same meaning as $Q^{41}$, $Q^{42}$, $M^{41}$, $n^{41}$, and $n^{42}$, respectively, and their preferred ranges are the same as those described for $Q^{41}$, $Q^{42}$, $M^{41}$, $n^{41}$, and $n^{42}$, respectively.

In formula (VI), $Y^{67}$ and $Y^{68}$ each have the same meaning as $Y^{47}$. The preferred range of $Y^{47}$ applies thereto.

$R^{61}$ has the same meaning and the same preferred range as $R^{45}$. $R^{62}$, $R^{63}$, $R^{64}$, and $R^{65}$ each represent a substituent. The substituent includes those described as for $R^{41}$, prefer- ably an alkyl group, an aryl group, an alkenyl group, a halogen atom, an alkoxy group, a dialkylamino group, and a group that forms a condensed ring structure when connected to an adjacent one, still preferably an alkyl group and a fluorine atom. Where $n^{62}$, $n^{63}$, $n^{64}$ or $n^{65}$ is 2 or greater, $R^{62}$'s, $R^{63}$'s, $R^{64}$'s or $R^{65}$'s may be the same or different, or adjacent two of them may be taken together to form a condensed ring (e.g., a benzo-condensed ring).

$n^{62}$, $n^{63}$, $n^{64}$, and $n^{65}$ each represent 0 to 4, preferably 0 to 2, still preferably 0 or 1, particularly preferably 0.

The compound used in the present invention may be either a low-molecular compound or a polymeric compound, including an oligomer, preferably having a polystyrene equivalent weight average molecular weight of 1,000 to 5,000,000, still preferably 2,000 to 1,000,000, particularly preferably 3,000 to 100,000. The polymeric compound contains the structure represented by formula (I) in its main chain or side chain. The polymeric compound may be either a homopolymer or a copolymer. The compound of the invention is preferably a low-molecular compound.

Specific but non-limiting examples of the compound represented by formula (I) are shown below.

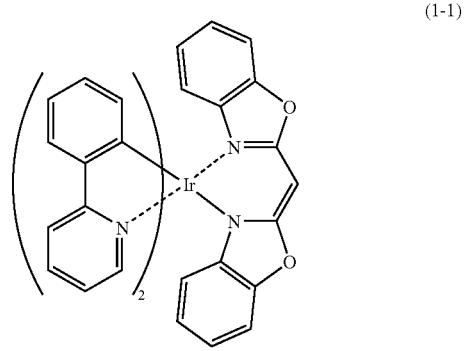

(1-1)

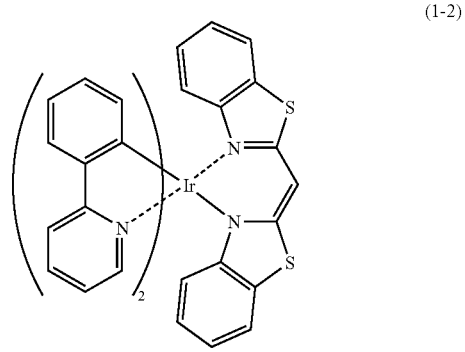

(1-2)

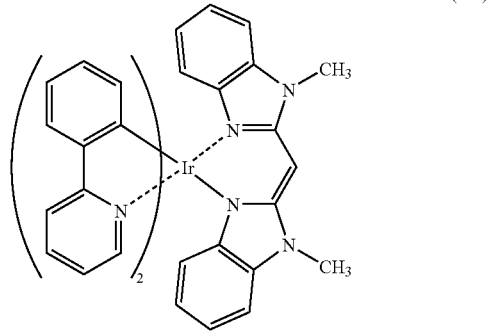

(1-3)

(1-4)
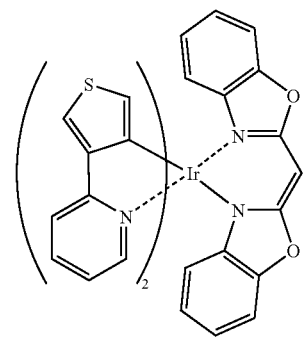
(1-5)
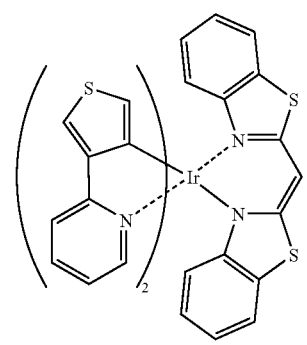
(1-6)
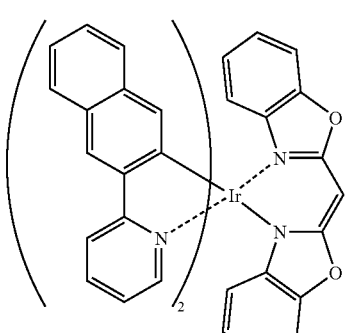
(1-7)
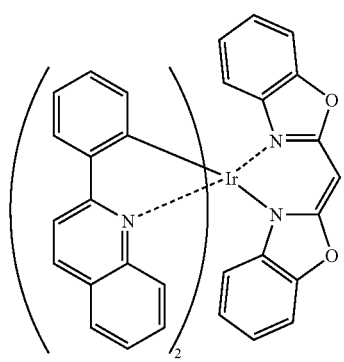
(1-8)
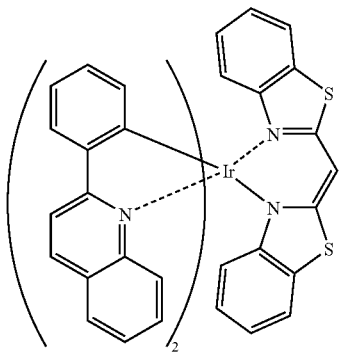
(1-9)
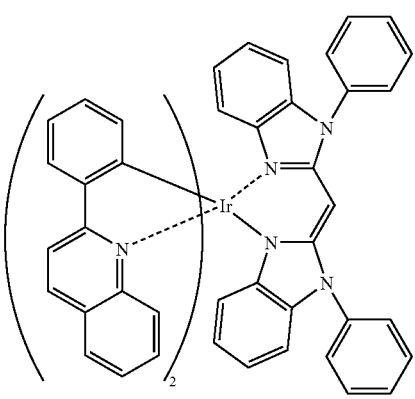
(1-10)
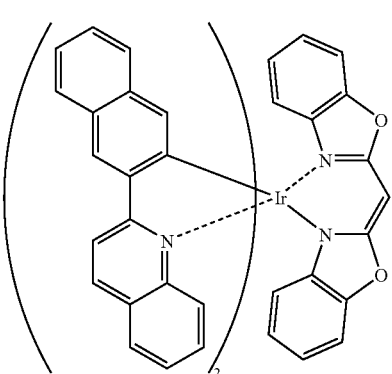
(1-11)
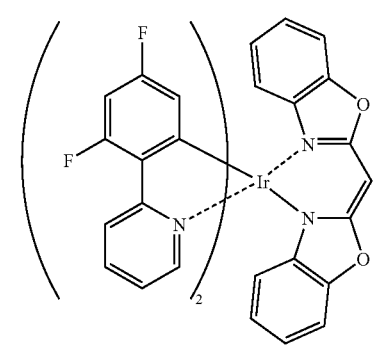

-continued
(1-12)
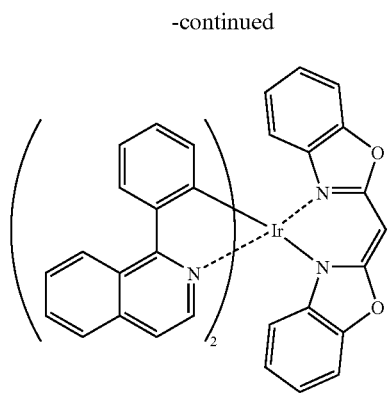
(1-13)
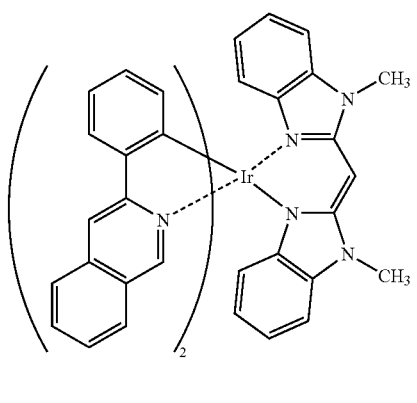
(1-14)
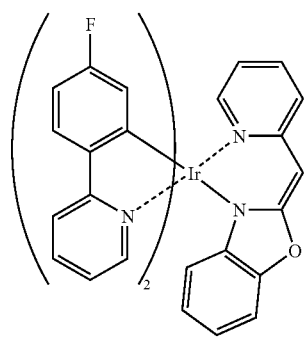
(1-15)
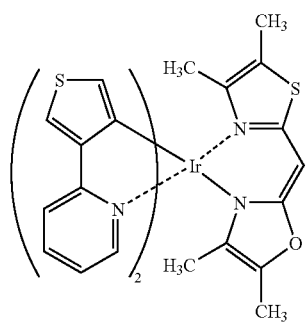
(1-16)
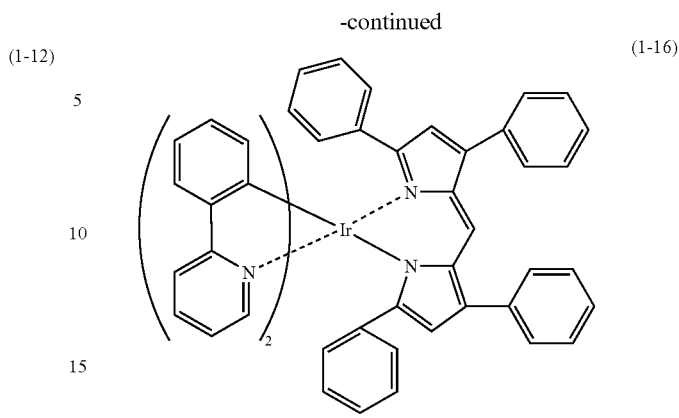
(1-17)
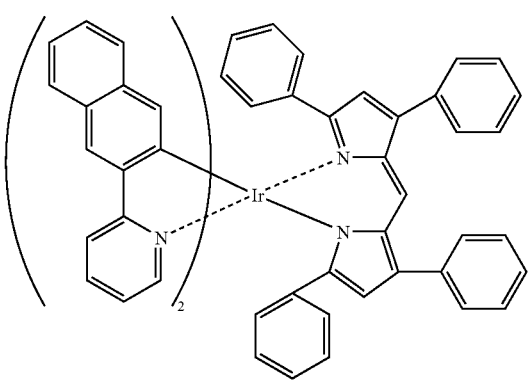
(1-18)
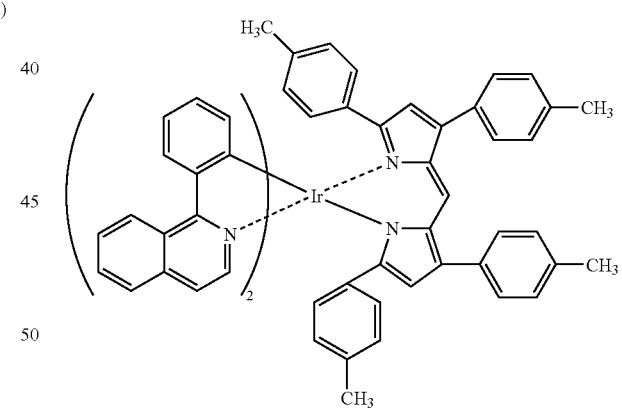
(1-19)
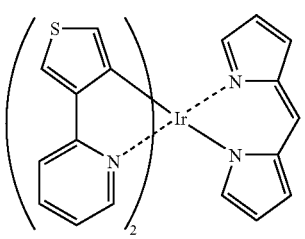

-continued
(1-20)
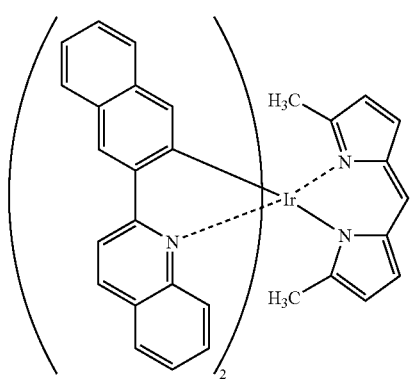
(1-21)
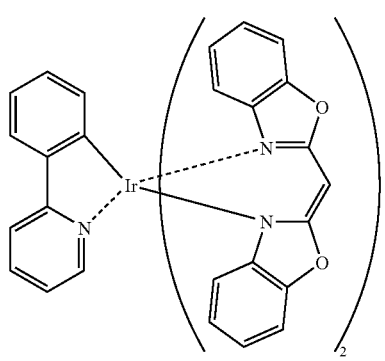
(1-22)
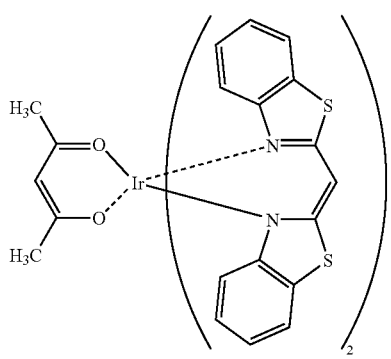
(1-23)
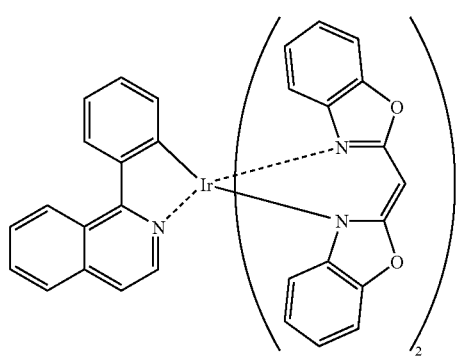
(1-24)
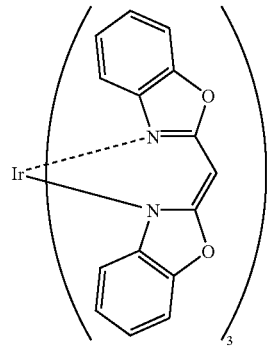
(1-25)
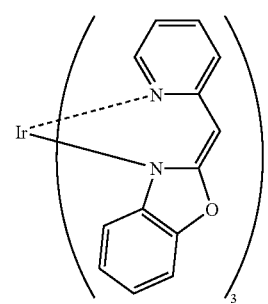
(1-26)
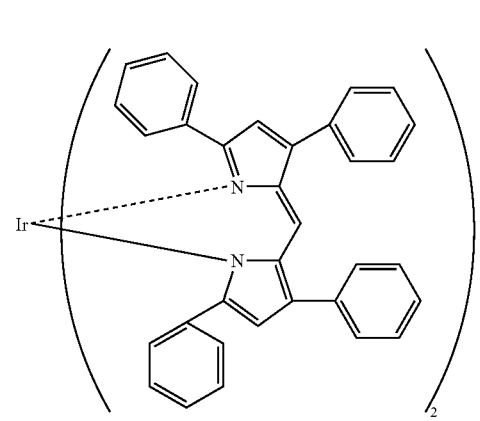
(1-27)
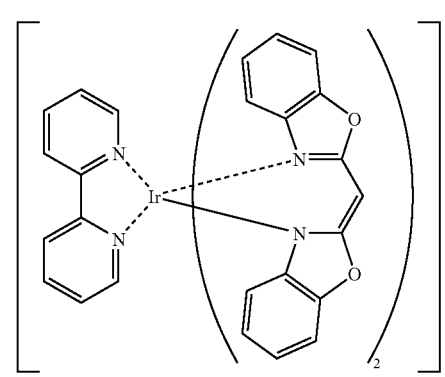

(1-28)
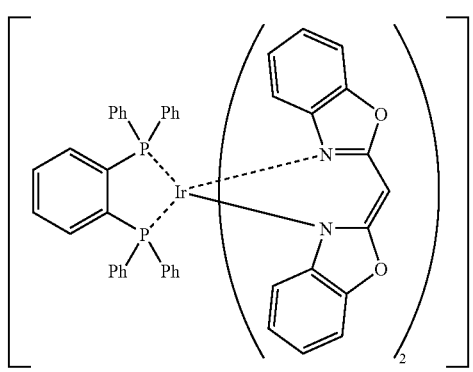
(1-32)
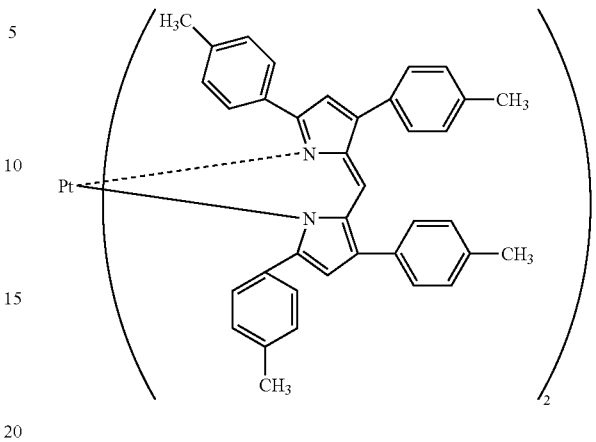
(1-29)
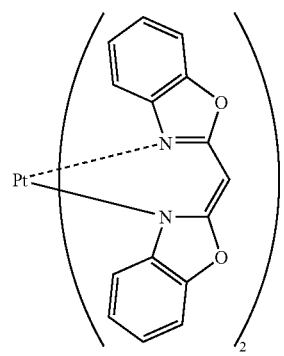
(1-33)
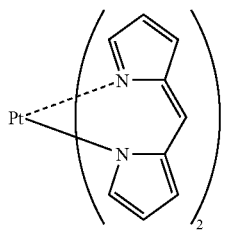
(1-34)
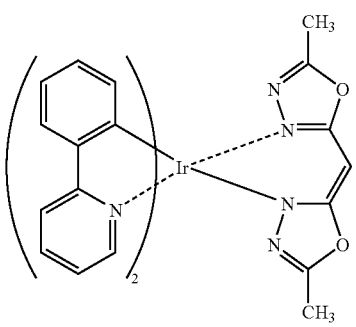
(1-30)
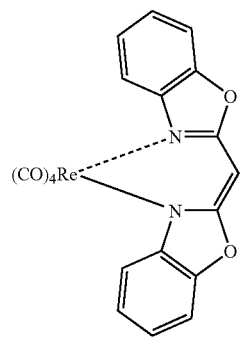
(1-31)
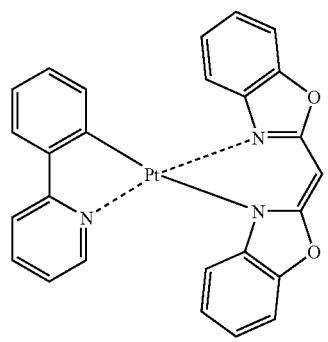
(1-35)
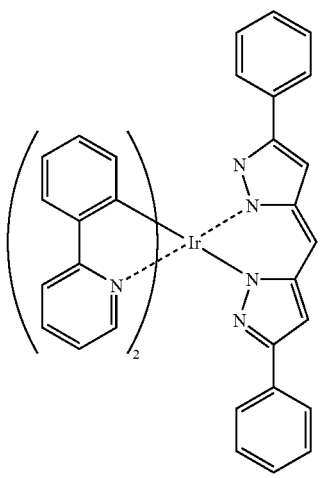

-continued (1-36)
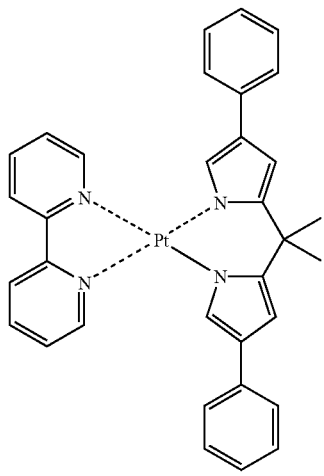

(1-37)
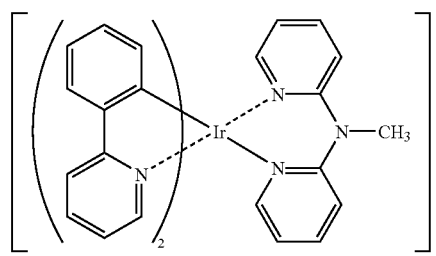
(ClO₄)

(1-38)
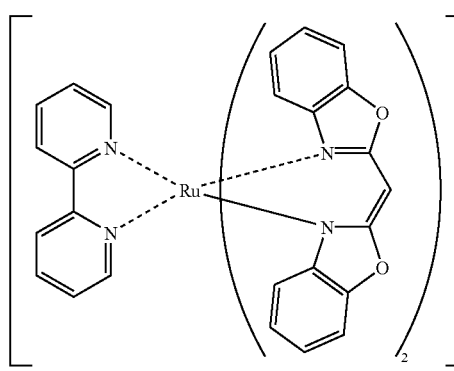
(ClO₄)

(1-39)
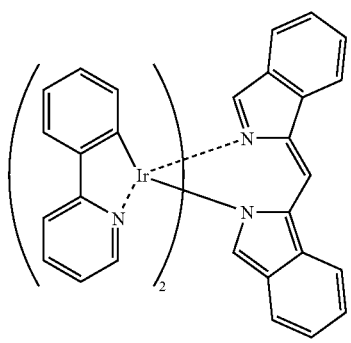

-continued (1-40)
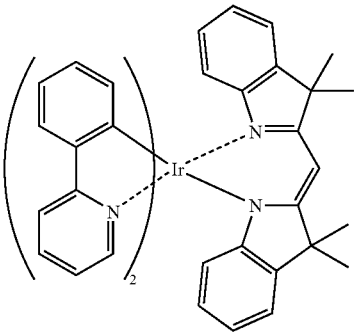

The compound of formula (I) can be synthesized through various techniques. For example, the compound is synthesized by reacting a ligand or its dissociated form with a transition metal compound with or without a solvent (e.g., a halogen-containing solvent, an alcohol, an ether, an ester, a ketone, a nitrile, an amide, a sulfone solvent, a sulfoxide solvent or water) in the presence or absence of an organic or inorganic base (e.g., sodium methoxide, potassium t-butoxide, triethylamine or potassium carbonate) at room temperature or below or under heating. Where the reaction is carried out under heating, not only ordinary heating means but microwave heating are effective.

The reaction time varies according to the reaction activity. It typically ranges from 1 minute to 5 days, preferably 5 minutes to 3 days, still preferably 10 minutes to 1 day.

The reaction time is also subject to variation according to the reaction activity. It typically ranges from 0 to 300° C., preferably 5 to 200° C., still preferably 10 to 150° C., particularly preferably 15 to 120° C.

The ligand to be reacted, which becomes a partial structure of a desired complex compound of formula (I), includes a bisbenzoxazolylmethylene ligand used to synthesize a complex having a bisbenzoxazolylmethylene structure, an acetylacetone ligand used to give a complex having an acetylacetone structure, and a phenylpyridine ligand used to give a complex having a phenylpyridine structure. The ligand is used in an amount usually of 0.5 to 10 equivalents, preferably 0.8 to 6 equivalents, still preferably 1 to 4 equivalents, to the transition metal compound.

The light-emitting device (LED) according to the present invention is not limited by configuration, driving mode, use, and so forth as long as the compound of the invention is made use of. An organic electroluminescent device (OELD) is a typical one.

The LED of the invention preferably contains the compound in its light-emitting layer or organic compounds layer including a light-emitting layer in an amount of 0.1 to 100% by weight, particularly 1 to 50% by weight, especially 1 to 20% by weight, based on the layer to which it is added.

The LED preferably has a layer containing a compound having an ionization potential of 5.9 eV or higher, particularly 6.0 eV or higher, between the cathode and the light-emitting layer. More preferably, an electron-transporting layer having an ionization potential of 5.9 eV or higher is provided between the cathode and the light-emitting layer.

Methods for forming an organic layer containing the compound include, but are not limited to, vacuum deposition by resistance heating or electron beam, sputtering, molecular accumulation, wet coating (spray coating, dip coating, impregnation, roll coating, gravure coating, reverse coating, roll brush coating, air knife coating, curtain coating, spin coating, flow coating, bar coating, microgravure coating, air doctor coating, blade coating, squeegee coating, transfer roll coating, kiss coating, casting, extrusion coating, wire bar coating, screen coating, etc.), ink jet method, printing, and transfer. From the standpoint of film characteristics and production, resistance heating vacuum deposition, wet coating, and transfer are preferred.

The LED of the invention is a device having at least one organic compound layer (also called an organic layer) including a light-emitting layer between a pair of electrodes, an anode and a cathode. The LED may have additional layers, such as a hole-injecting layer, a hole-transporting layer, an electron-injecting layer, an electron-transporting layer, and a protective layer, in addition to the light-emitting layer. Each of these layers may have functions other than the one meant by the designation of the layer. These layers can be formed of the respective materials.

The anode supplies positive holes to organic compound layers, such as a hole-injecting layer, a hole-transporting layer, and a light-emitting layer. Materials making up the anode include metals, alloys, metal oxides, electrically conductive compounds, and mixtures thereof. Those having a work function of 4 eV or higher are preferred. Examples of useful materials are electrically conductive metal oxides, such as tin oxide, zinc oxide, indium oxide, and indium tin oxide (ITO); metals, such as gold, silver, chromium, and nickel; mixtures or laminates of these metals and conductive metal oxides; inorganic electrically conductive substances, such as copper iodide and copper sulfide; organic electrically conductive substances, such as polyaniline, polythiophene, and polypyrrole; and laminates of these materials and ITO. Conductive metal oxides are preferred. ITO is especially preferred for its productivity, electrical conductivity, and transparency. The thickness of the anode is decided appropriately according to the material and usually ranges from 10 nm to 5 μm, preferably 50 nm to 1 μm, still preferably 100 to 500 nm.

The anode is usually used as formed on a substrate, such as a soda lime glass plate, an alkali-free glass plate or a transparent resin plate. When a glass substrate is chosen, alkali-free glass is preferred for avoiding leaching of ions from glass. In using soda lime glass, one having a barrier coat of silica, etc. is preferred. The thickness of the substrate is not particularly limited as long as the device can maintain mechanical strength. A glass substrate, for example, usually has a thickness of 0.2 mm or larger, preferably 0.7 mm or larger.

The anode is formed by an appropriate technique chosen according to the material. For instance, an ITO layer is formed by electron beam deposition, sputtering, resistance heating vacuum deposition, chemical reaction (e.g., a sol-gel process) application of an ITO dispersion, and the like.

The anode thus formed may be subjected to cleaning or a like treatment for reducing the driving voltage or increasing luminescence efficiency. For an ITO anode, for instance, a UV-ozone treatment or a plasma treatment is effective.

The cathode supplies electrons to the organic layers such as an electron-injecting layer, an electron-transporting layer, and a light-emitting layer. The material making up the cathode is selected taking into consideration adhesion to an adjacent layer, such as an electron-injecting layer, an electron-transporting layer or a light-emitting layer. Useful materials include metals, alloys, metal halides, metal oxides, electrically conductive compounds, and mixtures thereof. Examples of useful materials are alkali metals (e.g., Li, Na, and K) and fluorides or oxides thereof, alkaline earth metals (e.g., Mg and Ca) and fluorides or oxides thereof, gold, silver, lead, aluminum, sodium-potassium alloys or mixtures, lithium-aluminum alloys or mixtures, magnesium-silver alloys or mixtures, and rare earth metals (e.g., indium and ytterbium). Preferred of them are those having a work function of 4 eV or less, particularly aluminum, lithium-aluminum alloys or mixtures, and magnesium-silver alloys or mixtures. The cathode has a single layer structure composed of the above-recited material or a laminate structure containing the above-recited material. For example, an aluminum/lithium fluoride laminate structure or an aluminum/lithium oxide structure is preferred. The thickness of the cathode is selected appropriately according to the material and usually ranges from 10 nm to 5 μm, preferably 50 nm to 1 μm, still preferably 100 nm to 1 μm.

The cathode can be formed by electron beam deposition, sputtering, resistance heating vacuum deposition, wet coating, transfer, and the like. In vacuum deposition, a single metal may be deposited, or two or more components may be deposited simultaneously. A plurality of metals may be deposited simultaneously to form an alloy cathode, or a previously formulated alloy may be deposited.

The anode and the cathode each preferably have as low sheet resistance as possible, particularly a sheet resistance lower than several hundreds of ohms per square.

Any materials can be used to make the light-emitting layer as long as the resulting layer receives both positive holes from the anode, a hole-injecting layer or a hole-transporting layer and electrons from the cathode, an electron-injecting layer or an electron-transporting layer and provides a site where the holes and electrons can be transported and recombined to cause light emission. In addition to the compound of formula (I), useful materials for making the light-emitting layer include benzoxazole, benzimidazole, benzothiazole, styrylbenzene, polyphenyl, diphenylbutadiene, tetraphenylbutadiene, naphthylimide, coumarin, perylene, perinone, oxadiazole, aldazine, pyrralidine, cyclopentadiene, bisstyrylanthracene, quinacridone, pyrrolopyridine, thiadiazolopyridine, styrylamine, aromatic dimethylidyne compounds; various metal complexes typified by metal complexes or rare earth element complexes of 8-quinolinol; polymers, such as polythiophene, polyphenylene, and polyphenylene vinylene; organic silanes; transition metal complexes typified by an iridium-trisphenylpyridine complex and a platinum-porphyrin complex; and derivatives of these compounds. The thickness of the light-emitting layer is not particularly limited and usually ranges from 1 n to 5 μm, preferably 5 n to 1 μm, still preferably 10 to 500 nm.

Methods of forming the light-emitting layer include, but are not limited to, resistance heating vacuum deposition, electron beam deposition, sputtering, molecular accumulation, wet coating, ink jet method, printing, LB method, and transfer. Resistance heating vacuum deposition and wet coating methods are preferred.

The light-emitting layer can be made of a single compound or a plurality of compounds. The LED can have one or more light-emitting layers. The two or more light-emitting layers may emit light of different colors to emit white light as a whole. A single light-emitting layer can be designed to emit white light. Each of the two or more light-emitting layers may be made of a single material or a mixture of two or more materials.

Any materials can be used to form the hole-injecting layer and the hole-transporting layer as long as the resulting layer performs at least one of a function of injecting holes supplied by the anode, a function of transporting holes, and a function of blocking the electrons injected from the cathode. Examples of such materials include the compounds of the invention; carbazole, triazole, oxazole, oxadiazole, imidazole, polyarylalkanes, pyrazoline, pyrazolone, phenylenediamine, arylamines, amino-substituted chalcones, styrylanthracene, fluorenone, hydrazone, stilbene, silazane, aromatic tertiary amine compounds, styrylamine compounds, aromatic dimethylidyne compounds, porphyrin compounds, polysilane compounds, poly(N-vinylcarbazole), aniline copolymers; conductive oligomers, such as thiophene oligomers and polythiophene; organic silanes; and derivatives of these compounds. A carbon membrane is also useful. The thickness of the hole-injecting layer and the hole-transporting layer is not particularly limited and usually ranges from 1 nm to 5 μm, preferably 5 nm to 1 μm, still preferably 10 to 500 nm. The hole-injecting layer and the hole-transporting layer may each have a single layer structure made of one or more of the above-recited materials or a multilayer structure composed of two or more layers having the same or different compositions.

The hole-injecting layer and the hole-transporting layer are each formed by, for example, vacuum deposition, LB method, wet coating with a solution or dispersion of a hole-injecting or transporting material in a solvent, ink jet method, printing, or transfer. Where wet coating techniques are adopted, it is possible to apply a resin component as a solute or dispersoid together with the hole-injecting or transporting material. Applicable resin components include polyvinyl chloride, polycarbonate, polystyrene, polymethyl methacrylate, polybutyl methacrylate, polyester, polysulfone, polyphenylene oxide, polybutadiene, poly(N-vinylcarbazole), hydrocarbon resins, ketone resins, phenoxy resins, polyamide, ethyl cellulose, polyvinyl acetate, ABS resins, polyurethane, melamine resins, unsaturated polyester resins, alkyd resins, epoxy resins, and silicone resins.

Any materials can be used to make up the electron-injecting layer and the electron-transporting layer as long as the resulting layer performs at least one of a function of injecting electrons from the cathode, a function of transporting the electrons, and a function of blocking positive holes from the anode. Such materials include the compounds of the invention; triazole, oxazole, oxadiazole, imidazole, fluorenone, anthraquinodimethane, anthrone, diphenylquinone, thiopyran dioxide, carbodiimide, fluorenylidenemethane, distyrylpyrazine, heterocyclic (e.g., naphthalene or perylene) tetracarboxylic acid anhydrides, phthalocyanine, various metal complexes, such as metal complexes of 8-quinoliol, metallo-phthalocyanines, and metal complexes having benzoxazole or benzothiazole as a ligand, organic silanes, and derivatives of these compounds. The thickness of the electron-injecting layer and the electron-transporting layer is not particularly limited and usually ranges from 1 nm to 5 μm, preferably 5 nm to 1 μm, still preferably 10 to 500 nm. The electron-injecting layer and the electron-transporting layer may each have a single layer structure made of one or more of the above-recited materials or a multilayer structure composed of two or more layers having the same or different compositions.

The electron-injecting layer and the electron-transporting layer are each formed by, for example, vacuum deposition, LB method, wet coating with a solution or dispersion of an electron-injecting or transporting material in a solvent, ink jet method, printing, or transfer. Where wet coating techniques are adopted, it is possible to apply a resin component as a solute or dispersoid together with the electron-injecting or transporting material. Applicable resin components include those enumerated above with respect to the hole-injecting or transporting layer.

The protective layer can be of any material that prevents substances which may accelerate deterioration of the device, such as moisture and oxygen, from entering the device. Such materials include metals, e.g., In, Sn, Pb, Au, Cu, Ag, Al, Ti, and Ni; metal oxides, e.g., MgO, SiO, $SiO_2$, $Al_2O_3$, GeO, NiO, CaO, BaO, $Fe_2O_3$, $Y_2O_3$, and $TiO_2$; metal fluorides, e.g., $MgF_2$, LiF, $AlF_3$, and $CaF_2$; nitrides, e.g., $SiN_x$ and $SiO_xN_y$; polyethylene, polypropylene, polymethyl methacrylate, polyimide, polyurea, polytetrafluoroethylene, polychlorotrifluoroethylene, polydichlorodifluoroethylene, chlorotrifluoroethylene-dichlorodifluoroethylene copolymers, tetrafluoroethylene copolymers, fluorine-containing copolymers having a cyclic structure in the main chain thereof; water absorbing substances having a water absorption of at least 1%; and moisture-proof substances having a water absorption of 0.1% or less.

Methods for forming the protective layer include, but are not limited to, vacuum evaporation, sputtering, reactive sputtering, molecular beam epitaxy, cluster ion beam-assisted deposition, ion plating, plasma polymerization (radiofrequency-excited ion plating), plasma-enhanced CVD, laser-assisted CVD, thermal CVD, gas source CVD, wet coating techniques, printing, and transfer.

EXAMPLES

The present invention will now be illustrated in greater detail with reference to Examples, but it should be understood that the present invention is not deemed to be limited thereto. Unless otherwise noted, all the percents and ratios are by weight. Compound (1–7) used in Examples was synthesized as follows.

In 5 ml of chloroform were dissolved 0.2 g of compound (a) shown below, obtainable by the process disclosed in JP-A-2001-345183, and 0.1 g of compound (b) shown below, obtainable from a malonic acid derivative and o-aminophenol. To the solution was added 0.09 ml of a 28% methanolic solution of sodium methoxide, and the mixture was stirred under reflux for 2 hours. The reaction mixture was cooled to room temperature, and 20 ml of chloroform and 20 ml of water were added thereto for liquid-liquid separation. The organic layer was concentrated and purified by silica gel column chromatography using chloroform as a developing solution to give 0.05 g of compound (1–7). On irradiating a chloroform solution of compound (1–7) with ultraviolet light, the solution emitted reddish orange light having a maximum wavelength of 595 nm.

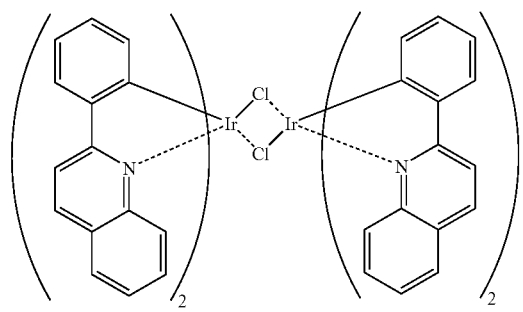
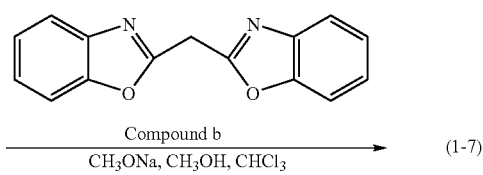

Compound a

Comparative Example 1

A cleaned ITO substrate was set in a vacuum deposition apparatus. N,N'-diphenyl-N,N'-di(m-tolyl)benzidine (TPD) was deposited on the substrate to a thickness of 30 nm. Then, compound (A) shown below and tris(8-hydroxyquinolinato) aluminum complex (Alq) were co-deposited on the TPD layer at a ratio of 1:17 to a deposition thickness of 45 nm. A pattern mask (having a pattern giving a light-emitting area of 4 mm by 5 mm) was put on the thus formed organic thin film, and magnesium and silver were co-deposited at a ratio of 7:1 to a thickness of 50 nm through the mask in a vacuum evaporation apparatus. Finally, silver was deposited to a thickness of 100 nm to complete an OELD.

Compound (A):

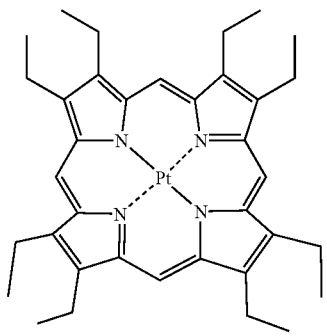

On applying a constant DC voltage to the resulting OLED by use of Source-Measure Unit Model 2400 supplied by Toyo Corp., red light emission was obtained with a maximum luminance of 280 cd/m² as measured with a luminance meter BM-8 supplied by Topcon.

Comparative Example 2

A cleaned ITO substrate was set in a vacuum deposition apparatus. TPD was deposited on the substrate to a thickness of 50 nm. Then, compound (A) and compound (C) shown below were co-deposited thereon at a ratio of 1:17 to a deposition thickness of 36 nm. Azole compound (B) shown below was deposited thereon to a thickness of 36 nm. A pattern mask (having a pattern giving a light-emitting area of 4 mm by 5 mm) was put on the thus formed organic thin film, and lithium fluoride and aluminum were successively vacuum deposited in a vacuum deposition apparatus to a thickness of 3 nm and 60 nm, respectively, to complete an OELD.

On applying a constant DC voltage to the resulting OLED by use of Source-Measure Unit Model 2400, red light emission was obtained with a maximum luminance of 300 cd/M² as measured with a luminance meter BM-8.

Compound (B):

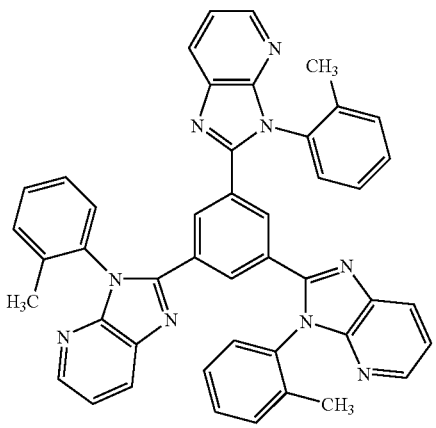

Compound (C):

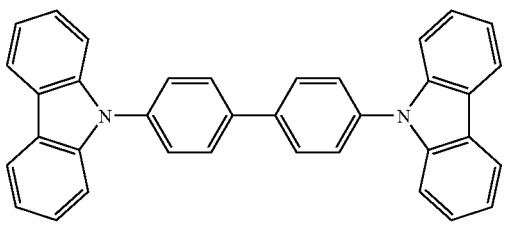

Example 1

An OELD was produced and evaluated in the same manner as in Comparative Example 2, except for replacing compound (A) with compound (1–7) of the present invention. The OELD emitted reddish orange light having a maximum luminance of 3200 cd/m².

Example 2

In 2.5 ml of dichloroethane were dissolved 40 mg of polyvinylcarbazole, 12 mg of 2-(4-t-butylphenyl)-5-(p-biphenyl)-1,3,4-oxadiazole, and 1 mg of compound (1–7) of the present invention. The solution was applied to a cleaned ITO substrate by spin coating at 2000 rpm for 20 seconds. The organic layer thus formed was about 100 nm thick. In the same manner as in Comparative Example 1, magnesium and silver were co-deposited on the organic layer at a ratio of 7:1 to a thickness of 50 nm, and silver was then deposited thereon to a thickness of 100 nm to form a cathode. The resulting OELD was evaluated in the same manner as in Comparative Example 1. As a result, the OELD emitted reddish orange light having a maximum luminance of 1500 cd/m².

High-luminance OELDs emitting light of various colors were obtained in the same manner by using other compounds of the present invention.

The light-emitting device according to the invention is capable of light emission at a high luminance. Use of the compound of the invention makes it feasible to produce a device emitting light of various colors (particularly orange to red). The light-emitting device of the invention is suited for use in the fields of display devices, displays, backlights, light sources for electrophotography, illumination, recording, exposure or reading, signs or signboards, interior decorations, optical communications, and the like. The compound of the invention is also applicable to medical use, fluorescent whitening agents, photographic materials, UV absorbing materials, laser dyes, color filter dyes, color conversion filters, etc.

This application is based on Japanese Patent application JP 2002-287390, filed Sep. 30, 2002, the entire content of which is hereby incorporated by reference, the same as if set forth at length.

What is claimed is:

1. An organic electroluminescent device comprising:
a pair of electrodes; and
at least one organic layer provided between the pair of electrodes, at least one of the at least one organic layer being a light emitting layer,
wherein the light-emitting layer comprises a compound represented by the formula (II):

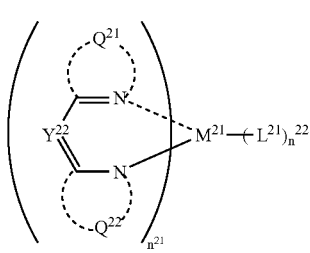

(II)

wherein $Q^{21}$ and $Q^{22}$ each represent a group necessary to form a nitrogen-containing heterocyclic ring; $Y^{22}$ represents a nitrogen atom or a substituted or unsubstituted carbon atom; $M^{21}$ represents a transition metal ion; $L^{21}$ represents a ligand; $n^{21}$ represents an integer of 1 to 3; and $n^{22}$ represents an integer of 0 to 4; with proviso that a compound in which $Q^{21}$ and $Q^{22}$ are connected together to form a porphyrin ring is excluded.

2. An organic electroluminescent device comprising:
a pair of electrodes; and
at least one organic layer provided between the pair of electrodes, at least one of the at least one organic layer being a light emitting layer,
wherein the light-emitting layer comprises a compound represented by the formula (III):

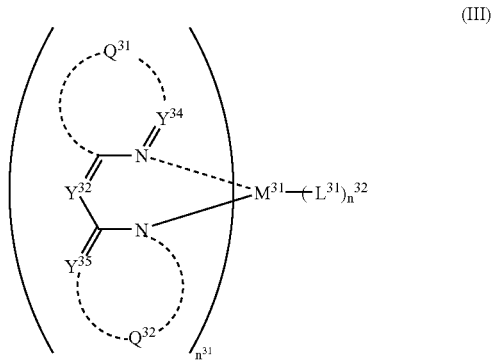

(III)

wherein $Q^{31}$ and $Q^{32}$ each represent a group necessary to form a nitrogen-containing heterocyclic ring; $Y^{32}$, $Y^{34}$, and $Y^{35}$ each represent a nitrogen atom or a substituted or unsubstituted carbon atom; $M^{31}$ represents a transition metal ion; $L^{31}$ represents a ligand; $n^{31}$ represents an integer of 1 to 3; and $n^{32}$ represents an integer of 0 to 4.

3. The organic electroluminescent device of claim 1, wherein the compound represented by the formula (II) is a compound represented by the formula (IV):

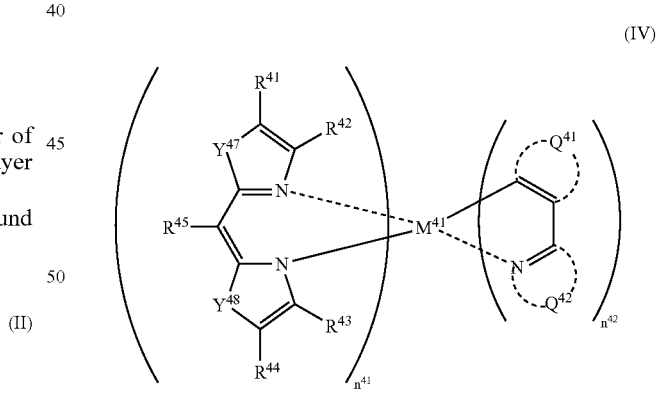

(IV)

wherein $R^{41}$, $R^{42}$, $R^{43}$, $R^{44}$, and $R^{45}$ each represent a hydrogen atom or a substituent; $Y^{47}$ and $Y^{48}$ each represent an oxygen atom, a sulfur atom, a quaternary carbon atom or a substituted or unsubstituted nitrogen atom; $Q^{41}$ represents a group necessary to form an aromatic ring; $Q^{42}$ represents a group necessary to form a nitrogen-containing heterocyclic ring; $n^{41}$ and $n^{42}$ each represent 1 or 2; and $M^{41}$ represents a transition metal ion.

4. The organic electroluminescent device of claim 2, wherein the compound represented by the formula (III) is a compound represented by the formula (V):

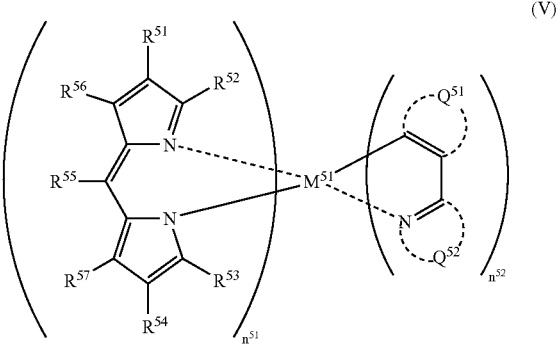

(V)

wherein $R^{51}$, $R^{52}$, $R^{53}$, $R^{54}$, $R^{55}$, $R^{56}$, and $R^{57}$ each represent a hydrogen atom or a substituent; $Q^{51}$ represents a group necessary to form an aromatic ring; $Q^{52}$ represents a group necessary to form a nitrogen-containing heterocyclic ring; $n^{51}$ and $n^{52}$ each represent 1 or 2; and $M^{51}$ represents a transition metal ion.

5. The organic electroluminescent device of claim 4, wherein the compound represented by the formula (V) is a compound represented by the formula (VI):

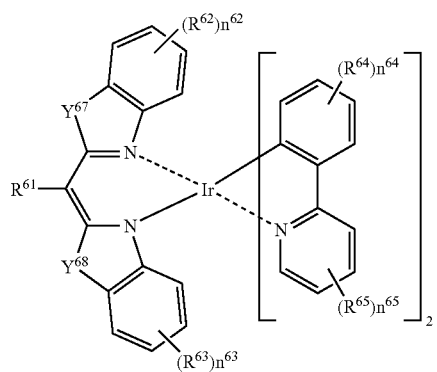

(VI)

wherein $Y^{67}$ and $Y^{68}$ each represent an oxygen atom, a sulfur atom, a quaternary carbon atom or a substituted or unsubstituted nitrogen atom; $R^{61}$, $R^{62}$, $R^{63}$, $R^{64}$, and $R^{65}$ each represent a substituent; and $n^{62}$, $n^{63}$, $n^{64}$, and $n^{65}$ each represent an integer of 0 to 4.

6. The organic electroluminescent device of claim 5, wherein $n^{62}$, $n^{63}$, $n^{64}$, and $n^{65}$ each represent an integer of 0 to 2.

7. The organic electroluminescent device of claim 5, wherein $n^{62}$, $n^{63}$, $n^{64}$, and $n^{65}$ each represent an integer of 0 or 1.

8. The organic electroluminescent device of claim 5, wherein $n^{62}$, $n^{63}$, $n^{64}$, and $n^{65}$ each represent 0.

9. The organic electroluminescent device of claim 1, wherein $M^{21}$ represents an iridium ion, a platinum ion, a rhenium ion or a ruthenium ion.

10. The organic electroluminescent device of claim 3, wherein $M^{41}$ represents an iridium ion, a platinum ion, a rhenium ion or a ruthenium ion.

11. The organic electroluminescent device of claim 4, wherein $M^{51}$ represents an iridium ion, a platinum ion, a rhenium ion or a ruthenium ion.

12. The organic electroluminescent device of claim 1, wherein $n^{21}$ represents 1 or 2.

13. The organic electroluminescent device of claim 1, wherein $n^{22}$ represents an integer of 0 to 2.

14. A compound represented by the formula (VI):

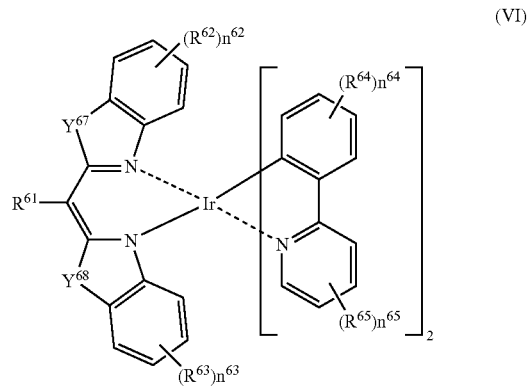

(VI)

wherein $Y^{67}$ and $Y^{68}$ each represent an oxygen atom, a sulfur atom, a quaternary carbon atom or a substituted or unsubstituted nitrogen atom; $R^{61}$, $R^{62}$, $R^{63}$, $R^{64}$, and $R^{65}$ each represent a substituent; and $n^{62}$, $n^{63}$, $^{64}$, and $n^{65}$ each represent an integer of 0 to 4.

15. The compound of claim 14, wherein $n^{62}$, $n^{63}$, $n^{64}$, and $n^{65}$ each represent an integer of 0 to 2.

16. The compound of claim 14, wherein $n^{62}$, $n^{63}$, $n^{64}$, and $n^{65}$ each represent an integer of 0 or 1.

17. The compound of claim 14, wherein $n^{62}$, $n^{63}$, $n^{64}$, and $n^{65}$ each represent 0.

18. An organic electroluminescent device comprising:
a pair of electrodes; and
at least one organic layer provided between the pair of electrodes, at least one of the at least one organic layer being a light emitting layer,
wherein the light-emitting layer comprises a compound represented by the formula (I):

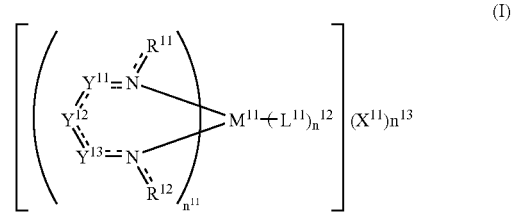

(I)

wherein $R^{11}$ and $R^{12}$ each represent a substituent; $Y^{11}$, $Y^{12}$, and $Y^{13}$ each represent a substituted carbon atom, $M^{11}$ represents iridium; $L^{11}$ represents 2-phenyl pyridine; $X^{11}$ represents a counter ion; $n^{11}$ represents an integer of 1; $n^{12}$ represents an integer of 2; and $n^{13}$ represents an integer of 0; with proviso that a compound in which $R^{11}$ and $R^{12}$ are connected together to form a porphyrin ring is excluded.

* * * * *